(12) United States Patent
Okino et al.

(10) Patent No.: US 6,894,291 B2
(45) Date of Patent: May 17, 2005

(54) APPARATUS AND METHODS FOR BLOCKING HIGHLY SCATTERED CHARGED PARTICLES IN A PATTERNED BEAM IN A CHARGED-PARTICLE-BEAM MICROLITHOGRAPHY SYSTEM

(75) Inventors: Teruaki Okino, Kamahura-chi (JP); Shintaro Kawata, Moriya (JP)

(73) Assignee: Nikon Corporation, Tokyo (JP)

( * ) Notice: Subject to any disclaimer, the term of this patent is extended or adjusted under 35 U.S.C. 154(b) by 307 days.

(21) Appl. No.: 09/997,646

(22) Filed: Nov. 28, 2001

(65) Prior Publication Data

US 2002/0123168 A1 Sep. 5, 2002

(30) Foreign Application Priority Data

Dec. 1, 2000 (JP) .......................... 2000-366846

(51) Int. Cl.[7] ................................................. G21G 5/00
(52) U.S. Cl. .................................................. 250/492.1
(58) Field of Search ......................... 250/492.1, 492.23, 250/492.3

(56) References Cited

U.S. PATENT DOCUMENTS

| 5,130,213 A | | 7/1992 | Berger et al. | |
| 5,674,413 A | * | 10/1997 | Pfeiffer et al. | 219/121.25 |
| 6,087,669 A | * | 7/2000 | Suzuki | 250/492.23 |
| 6,151,101 A | * | 11/2000 | Okino | 355/53 |
| 6,573,515 B1 | * | 6/2003 | Suzuki | 250/492.2 |

OTHER PUBLICATIONS

Koops et al., "Submicron Lithography by Demagnifying Electron–Beam Projection," in Schmahl et al., *X–Ray Microscopy, Springer Series in Optical Sciences* vol. 43:118–129, Springer Verlag, Berlin, 1984.

* cited by examiner

*Primary Examiner*—Zandra V. Smith
(74) *Attorney, Agent, or Firm*—Klarquist Sparkman, LLP (57) ABSTRACT

Apparatus and methods are disclosed pertaining to microlithography performed using a charged particle beam. In an exemplary apparatus, the projection-optical system includes a first projection lens situated downstream of a pattern-defining reticle and a second projection lens situated downstream of the first projection lens. Between the first and second projection lenses is a back focal plane of the first projection lens, at which focal plane a beam crossover is formed. The projection-optical system includes a cutoff-plate assembly, including at least one aperture-defining cutoff plate, located between the reticle and the back focal plane. The respective aperture in each cutoff plate is wider than an aperture in a scattering aperture conventionally located at the back focal plane. If the cutoff-plate assembly includes multiple cutoff plates, the aperture defined in the cutoff plate closer to the reticle is wider than the aperture defined in the more downstream cutoff plate. At least one of the cutoff plates defines an aperture that is laterally extended in a beam-deflection direction in the projection-optical system.

12 Claims, 8 Drawing Sheets

APPARATUS AND METHODS FOR BLOCKING HIGHLY SCATTERED CHARGED PARTICLES IN A PATTERNED BEAM IN A CHARGED-PARTICLE-BEAM MICROLITHOGRAPHY SYSTEM

FIELD

This disclosure pertains to microlithography, which involves the transfer of a pattern (usually defined by a reticle or mask) onto a surface of a "sensitized" substrate such as a semiconductor wafer. Microlithography is a key technique used in the manufacture of microelectronic devices such as integrated circuits, displays, magnetic thin-film pickup heads, and micromachines. More specifically, the disclosure pertains to microlithography performed using a charged particle beam, such as an electron beam or ion beam, and a "scattering"-type reticle.

BACKGROUND

In recent years, the degree of integration of semiconductor integrated circuits and other microelectronic devices has continued to increase, with accompanying decreases in the "critical dimensions" (minimum feature size) of such devices. Currently, optical "steppers" are the workhorse microlithography systems used for manufacturing microelectronic devices. "Optical" microlithography is performed using a beam of ultraviolet light that illuminates a reticle defining the pattern to be transferred to the substrate. Light of the beam passing through the reticle is projected onto a resist-coated upstream-facing surface of a suitable substrate. The reticle is created normally by electron-beam "direct-mask writing."

With the relentless drive to progressively smaller feature sizes (now less than 0.25 $\mu$m) the pattern-resolution limitations of optical microlithography have become a major limitation. To solve this problem, considerable effort currently is being expended to develop a practical "next generation" microlithography technology. A major effort to such end involves using a charged particle beam (e.g., an electron beam) as the lithographic energy beam. Charged-particle-beam (CPB) microlithography is expected to produce substantially better pattern resolution for reasons similar to the reasons for which electron microscopy yields better image resolution than optical microscopy.

The first type of CPB microlithography that received serious attention was electron-beam direct writing on the lithographic substrate, in a manner similar to the technique that had been used for manufacturing reticles for use in optical microlithography. Because the pattern is drawn on the substrate feature-by-feature, the major drawback of electron-beam direct-writing is that throughput is extremely low. Consequently, various approaches have been considered for increasing the throughput of CPB microlithography. An approach currently being used to a limited extent involves any of the several "partial pattern block" exposure methods such as "cell projection," "character projection," and "block exposure." In the partial pattern block exposure methods, a very small portion (e.g., 5 $\mu$m square) of a circuit pattern (the portion typically being a highly repeated portion of the overall pattern, such as a single DRAM memory cell) is defined on a mask and repeatedly exposed onto respective regions of the substrate. Whereas partial pattern block exposure methods exhibit better throughput than direct-writing methods, the throughput still is too low for most mass-production purposes.

Furthermore, the non-repeated portions of the overall pattern must be exposed using a different technique, such as a "variable-shaped beam" method, which reduces overall throughput and increases the complexity of the lithographic process.

An approach that offers substantially improved throughput compared to partial pattern block exposure is "reduction" pattern transfer performed using a segmented reticle. (This technique also is termed "divided-reticle" pattern transfer.) In this approach, the entire pattern is defined on the reticle. However, since it currently is impossible to projection-expose the entire pattern in one exposure "shot" onto the substrate (see below), the pattern as defined on the reticle is divided into multiple "subfields" each defining a respective portion of the overall pattern. The subfields are exposed in respective shots from the reticle to the substrate. Exposure of an individual subfield involves projection of an image of the subfield using a projection "lens" that "reduces" (demagnifies) the subfield images as projected onto the substrate. The individual subfield images are formed on the substrate in respective locations serving to "stitch" the images together in a contiguous manner to form the entire projected pattern on the substrate after completing exposure of all the subfields.

As noted above, it currently is impossible to projection-expose an entire pattern using a charged particle beam. The principal reasons are as follows. (1) It currently is impossible to configure illumination- and projection-optical systems capable of projecting an entire die pattern in one shot without introducing excessive aberrations especially off-axis. (2) It currently is impossible to fabricate a reticle having sufficient size to define an entire pattern for one-shot exposure. Hence, the divided-reticle pattern-transfer technique offers the currently best prospects for achieving good lithographic resolution at an acceptable throughput.

Another advantage of the divided-reticle pattern-transfer method is that it allows certain corrective compensations to be performed in real time as each subfield is being exposed, thereby significantly improving pattern-transfer accuracy. These compensations include aberration corrections, image-magnification corrections, and image-position corrections of the illumination- and projection-optical systems of the microlithography apparatus. To expose each subfield, the charged particle beam is laterally deflected as required. In addition, the reticle and substrate are moved relative to each other to obtain proper positioning for exposure.

In the "cell projection" method summarized above, a so-called "absorption-stencil" mask is utilized, in which a minute pattern of through-holes is formed in a thin membrane of silicon. The through-holes correspond to respective pattern features, and the intervening portions of the membrane correspond to non-patterned regions. The membrane is relatively thick, approximately 20 $\mu$m. As an illumination beam impinges on such a mask, charged particles incident on the membrane are absorbed by the membrane, and charged particles incident on a through-hole pass unobstructed through the hole. Thus, the portion of the illumination beam transmitted through the mask is "patterned" by the mask (i.e., the beam acquires an aerial image of the pattern portion defined by the illuminated portion of the mask).

In a similar manner, absorption-stencil reticles are used in divided-reticle pattern-transfer methods. However, to improve throughput, the current trend is toward increasingly higher beam currents. Absorption of incident charged particles by a reticle membrane causes heating of the membrane, which can cause deformation of the membrane and hence of the pattern. As beam current is increased, this reticle heating becomes an increasingly serious problem. In many instances, absorption-stencil reticles are no longer practical because of an inability to control the excessive thermal expansion (and deformation) of the reticle.

As a result, "scattering-stencil" reticles have been investigated. With a scattering-stencil reticle, the pattern is defined as respective through-holes in a beam-scattering membrane. As a beam is incident on such a reticle, charged particles incident on the membrane are transmitted through the membrane, but with scattering. Charged particles incident on a through-hole simply pass through without any scattering. With such a reticle, the projection-optical system of the microlithography apparatus includes a "contrast aperture" ("scattering aperture") that blocks (by absorption) charged particles that were scattered during passage through the upstream reticle. Thus, the scattered charged particles are prevented from propagating to the downstream substrate. So as to block these scattered charged particles, the scattering aperture is situated in a beam-convergence plane of the projection lens, which is at the vicinity of the Fourier plane of the reticle. Non-scattered charged particles propagate through the scattering aperture to the substrate on which an image is formed.

In any type of stencil reticle, it is impossible to define certain pattern features such as "island" features having a membrane island surrounded by a through-hole. These features cannot be defined because the portion of the membrane forming the island is unsupported and simply falls away from the reticle. This problem is termed the "donut-pattern" problem. To solve the donut-pattern problem while using a stencil reticle, the through-hole surrounding the island must be divided between two separate pattern regions (subfields) on the reticle. The subfields (termed "complementary" subfields) are individually exposed at the same location on the substrate such that the respective through-hole portions are "stitched" together on the substrate and the island is properly situated within the pattern portion defined by the through-holes. This technique is termed "complementary pattern division." A disadvantage of complementary pattern division is that two exposures must be performed to form a complete pattern portion at a single transferred subfield on the substrate. This need to perform double exposures reduces throughput commensurately.

In view of the problems summarized above, "scattering-membrane" reticles have been proposed. This type of reticle comprises a thin charged-particle scattering membrane on which pattern features are defined by corresponding "scattering bodies" rather than by through-holes. The scattering bodies are formed from a correspondingly patterned "high-scatterer" film formed on the surface of the reticle membrane. The membrane is transmissive to incident charged particles, but particles passing only through the membrane experience minimal scattering. Charged particles incident on a scattering body also pass through the reticle but with high scattering. A scattering-membrane reticle does not have the donut-pattern problem because the membrane has no voids. Hence, using a scattering-membrane reticle can provide better throughput than using a stencil reticle.

An example of a CPB microlithography apparatus employing a scattering-membrane reticle is described in Japan Kôkai Patent Document No. Hei 8-34169 (1996). In this apparatus, a diaphragm defining a small axial aperture is provided at the beam-convergence plane of the projection lens. With such an aperture, almost all of the charged particles that are scattered during transmission through the reticle are blocked. This causes the temperature of the diaphragm to increase substantially during use due to the absorbed kinetic energy of charged particles colliding with the material of the diaphragm. As the diaphragm temperature increases, it undergoes a corresponding thermal expansion, which changes the amount of charged-particle irradiation (that has passed through the relatively non-scattering portions of the reticle) incident on the substrate. Also, a substantial current of charged particles is incident in the vicinity of the small axial aperture. This beam current causes rapid formation of contaminant deposits ("beam-induced contamination") that can cause any of various exposure faults at the substrate.

SUMMARY

In view of the shortcomings of conventional apparatus and methods, the present invention provides, inter alia, charged-particle-beam (CPB) microlithography apparatus that perform high-accuracy exposures using a more stable charged particle beam than obtained using conventional apparatus and methods.

According to a first aspect of the invention, CPB microlithography apparatus are provided. An embodiment of such an apparatus comprises, on an optical axis, an illumination-optical system and a projection-optical system. The illumination-optical system is situated and configured to direct a charged-particle illumination beam onto a selected region of a reticle defining a pattern to be transferred to a sensitive substrate. The reticle is configured with relatively low-scattering regions and relatively high-scattering regions that collectively define the pattern. The low-scattering regions are transmissive to the illumination beam while causing little to no scattering of charged particles of the beam, and the high-scattering regions are transmissive to the illumination beam while causing comparatively large scattering, relative to the low-scattering regions, of charged particles of the beam. The projection-optical system is situated downstream of the illumination-optical system and is configured to direct a patterned beam, formed by passage of the illumination beam through the selected region on the reticle and carrying an aerial image of a respective portion of the pattern defined in the selected region, to a corresponding location on a sensitive substrate. The projection-optical system comprises a first projection lens situated axially closer to the reticle and having a back focal plane, a second projection lens situated axially closer to the substrate, and a cutoff-plate assembly situated between the reticle and the back focal plane. The cutoff-plate assembly defines an aperture configured to block downstream propagation of at least 90% of the patterned beam scattered from the high-scattering regions of the reticle. This apparatus allows improved control over adverse effects to the patterned beam caused by destabilization of the beam or aperture contamination due to an increase in temperature of the scattering aperture (also termed "contrast aperture") conventionally used at the back focal plane.

The cutoff-plate assembly can be situated between the first projection lens and the back focal plane. Also, the cutoff-plate assembly desirably comprises multiple cutoff plates arranged at respective positions along the optical axis, wherein each diaphragm plate defines a respective aperture. In such a configuration, a first cutoff plate located closer to the reticle desirably has a larger aperture than a second cutoff plate located downstream of the first cutoff plate. By using multiple cutoff plates upstream of the back focal plane, scattered charged particles are blocked at each cutoff plate, thereby reducing beam instability that otherwise would arise from excessive temperature of, e.g., only one cutoff plate. The respective apertures are relatively large compared to the aperture in a conventional scattering aperture located at the back focal plane. These "staged" apertures provide optimal staged blocking of scattered charged particles.

Even if the cutoff-plate assembly comprises only one cutoff plate, the respective aperture desirably is configured as a slot laterally extended in a beam-deflection direction. An aperture configured in this manner allows most of the scattered charged particles to be blocked without cutting off a deflection-scanned patterned beam.

The illumination-optical system desirably is configured to accelerate the illumination beam at a voltage of at least 50 kV.

According to another aspect of the invention, projection-optical systems are provided. An embodiment of such a system comprises a first projection lens situated axially closer to the reticle and having a back focal plane, a second projection lens situated axially closer to the substrate, and a cutoff-plate assembly situated between the reticle and the back focal plane. The cutoff-plate assembly defines an aperture configured to block downstream propagation of at least 90% of charged particles of a charged particle beam scattered from the high-scattering regions of the reticle.

According to another aspect of the invention, CPB optical systems are provided. An embodiment of such a system comprises an illumination-optical system and a projection-optical system. The projection-optical system comprises a first projection lens situated axially closer to the reticle and having a back focal plane, a second projection lens situated axially closer to the substrate, and a cutoff-plate assembly situated between the reticle and the back focal plane. The cutoff-plate assembly defines an aperture configured to block downstream propagation of at least 90% of charged particles of a charged particle beam scattered from the high-scattering regions of the reticle.

According to yet another aspect of the invention, CPB microlithography methods are provided. In the various methods, a pattern, defined by a reticle including a relatively low-scattering portion and a relatively high scattering portion, is transferred from the reticle to a sensitive substrate using a charged particle beam. In an embodiment of such a method, a charged-particle illumination beam is directed to a selected region on the reticle including the relatively low-scattering portion and the relatively high-scattering portion so as to produce a patterned beam. The patterned beam propagates downstream of the reticle and contains charged particles that have been scattered by passage through the high-scattering portion. The patterned beam is directed through a projection-lens system to a selected corresponding region on the sensitive substrate. The projection-lens system includes a first projection lens situated downstream of the reticle and having a back focal plane, and a second projection lens situated downstream of the first projection lens. As the patterned beam is directed through the projection-optical system, downstream propagation of at least 90% of the charged particles that were scattered by passage through the high-scattering portion is blocked. The blocking is performed at a location between the reticle and the back focal plane. Desirably, the blocking step is performed using a cutoff-plate assembly located between the reticle and the back focal plane. The cutoff-plate assembly comprises at least one cutoff plate arranged at a respective position along an optical axis of the projection-lens system and defining a respective aperture.

The foregoing and additional features and advantages of the invention will be more readily apparent from the following detailed description, which proceeds with reference to the accompanying drawings.

DETAILED DESCRIPTION

This invention is described below in the context of representative embodiments, which are not intended to be limiting in any way.

Figure 2:
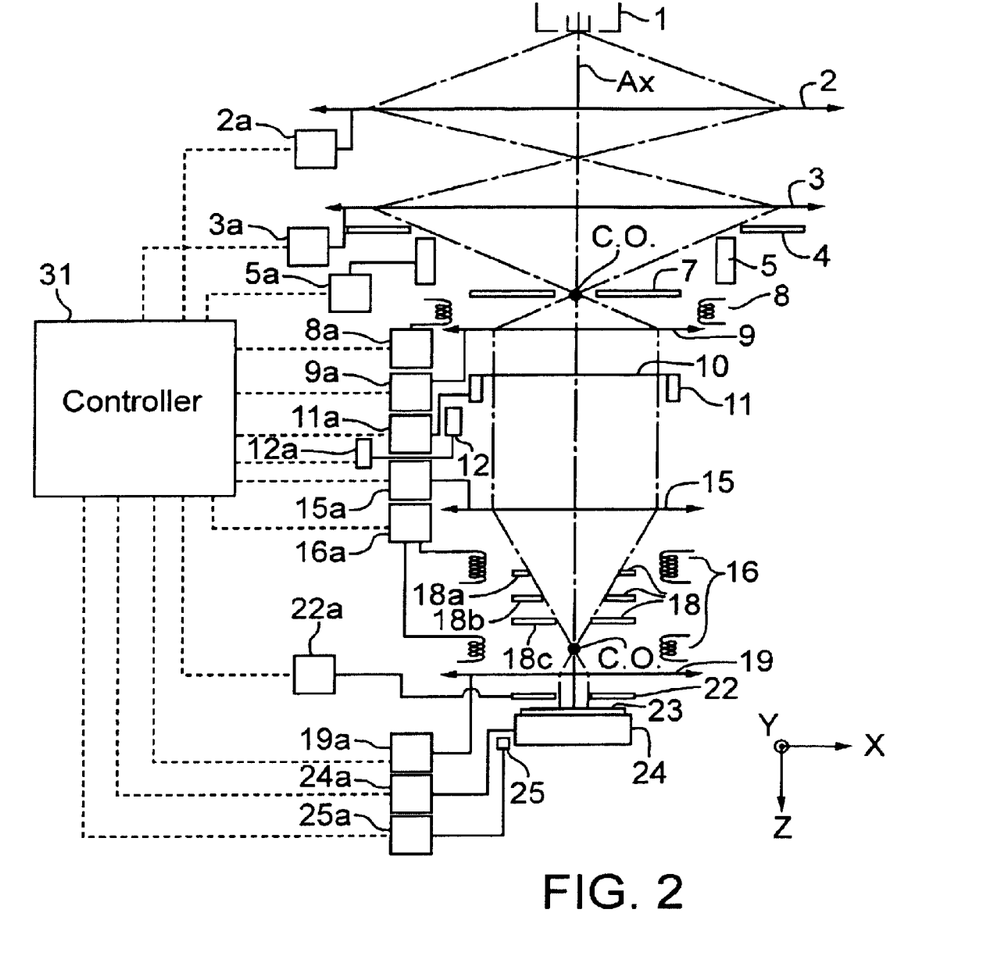
FIG. 2 in elevational schematic diagram of imaging relationships and control systems of a representative embodiment of a CPB microlithography apparatus that includes a cutoff-plate assembly.

FIG. 2 is a schematic elevational diagram of a charged-particle-beam (CPB) divided-reticle projection microlithography system incorporating certain aspects of the invention. The system of FIG. 2 is described in the context of using an electron beam as an exemplary charged-particle lithographic energy beam. It will be understood that the principles of the system in FIG. 2 can be applied with equal facility to use with another type of charged particle beam such as an ion beam. FIG. 2 also depicts general imaging and control relationships of the subject system.

Situated at the extreme upstream end of the system is an electron gun 1 that emits an electron beam propagating in a downstream direction generally along an optical axis Ax.

Downstream of the electron gun 1 are a first condenser lens 2 and a second condenser lens 3 collectively constituting a two-stage condenser-lens assembly. The condenser lenses 2, 3 converge the electron beam at a crossover C.O. situated on the optical axis Ax at a blanking diaphragm 7.

Downstream of the second condenser lens 3 is a "beam-shaping diaphragm" 4 comprising a plate defining an axial aperture (typically rectangular in profile) that trims and shapes the electron beam passing through the aperture. The aperture is sized and configured to trim the electron beam sufficiently to illuminate one exposure unit (subfield) on the reticle 10. An image of the beam-shaping diaphragm 4 is formed on the reticle 10 by an illumination lens 9.

The electron-optical components situated between the electron gun 1 and the reticle 10 collectively constitute an "illumination-optical system" of the depicted microlithography system. The electron beam propagating through the illumination-optical system is termed an "illumination beam" because it illuminates a desired region of the reticle 10. As the illumination beam propagates through the illumination-optical system, the beam actually travels in a downstream direction through an axially aligned "beam tube" (not shown but well understood in the art) that can be evacuated to a desired vacuum level.

A blanking deflector 5 is situated downstream of the beam-shaping aperture 4. The blanking deflector 5 laterally deflects the illumination beam as required to cause the illumination beam to strike the aperture plate of the blanking diaphragm 7, thereby preventing the illumination beam from being incident on the reticle 10.

A subfield-selection deflector 8 is situated downstream of the blanking diaphragm 7. The subfield-selection deflector 8 laterally deflects the illumination beam as required to illuminate a desired reticle subfield situated within the optical field of the illumination optical system. Thus, subfields of the reticle 10 are sequentially scanned by the illumination beam in a horizontal direction (X direction in the figure). The illumination lens 9 is situated downstream of the subfield-selection deflector 8.

During illumination thereof, the reticle 10 actually undergoes thermal expansion (discussed later below with reference to FIGS. 3(A)–3(C)) within a plane (X-Y plane) perpendicular to the optical axis Ax. The reticle 10 typically defines many subfields (e.g., tens of thousands of subfields). The subfields collectively define the pattern for a layer to be formed at a single die ("chip") on a lithographic substrate.

The reticle 10 is mounted on a movable reticle stage 11. Using the reticle stage 11, by moving the reticle 10 in a direction (Y and/or X direction) perpendicular to the optical axis Ax, it is possible to illuminate the respective subfields on the reticle 10 extending over a range that is wider than the optical field of the illumination-optical system. The position of the reticle stage 11 in the XY plane is determined using a "position detector" 12 typically configured as a laser interferometer. A laser interferometer is capable of measuring the position of the reticle stage 11 with extremely high accuracy in real time.

Situated downstream of the reticle 10 are first and second projection lenses 15, 19, respectively, and an imaging-position deflector 16. The illumination beam, by passage through an illuminated subfield of the reticle 10, becomes a "patterned beam" because the beam has acquired an aerial image of the illuminated subfield. The patterned beam is imaged at a specified location on a substrate 23 (e.g., "wafer") by the projection lenses 15, 19 collectively functioning as a "projection-lens assembly." To ensure imaging at the proper location, the imaging-position deflector 16 imparts the required lateral deflection of the patterned beam, as described later below with reference to FIG. 4.

So as to be imprintable with the image carried by the patterned beam, the upstream-facing surface of the substrate 23 is coated with a suitable "resist" that is imprintably sensitive to exposure by the patterned beam. When forming the image on the substrate, the projection-lens assembly "reduces" (demagnifies) the aerial image. Thus, the image as formed on the substrate 23 is smaller (usually by a defined integer-ratio factor termed the "demagnification factor") than the corresponding region illuminated on the reticle 10. By thus causing imprinting on the surface of the substrate 23, the apparatus of FIG. 2 achieves "transfer" of the pattern image from the reticle 10 to the substrate 23.

The components of the depicted electron-optical system situated between the reticle 10 and the substrate 23 are collectively termed the "projection-optical system." The substrate 23 is situated on a substrate stage 24 situated downstream of the projection-optical system. As the patterned beam propagates through the projection-optical system, the beam actually travels in a downstream direction through an axially aligned "beam tube" (not shown but well understood in the art) that can be evacuated to a desired vacuum level.

The projection-optical system forms a crossover C.O. of the patterned beam on the optical axis Ax at the back focal plane of the first projection lens 15. The position of the crossover C.O. on the optical axis Ax is a point at which the axial distance between the reticle 10 and substrate 23 is divided according to the demagnification ratio. Situated between the crossover C.O. (i.e., the back focal plane) and the reticle 10 is a cutoff-plate assembly 18. The cutoff-plate assembly 18 comprises at least one aperture plate (desirably multiple aperture plates, e.g., 18a, 18b, 18c as shown) each defining a respective aperture typically centered on the axis Ax. From upstream to downstream in this embodiment, the respective apertures are progressively smaller. Thus, with the cutoff-plate assembly 18 of this embodiment, electrons of the patterned beam that were scattered during transmission through the reticle 10 are progressively blocked so as not to reach the substrate 23. Details of the cutoff-plate assembly 18 of this embodiment are explained later below.

A backscattered-electron (BSE) detector 22 is situated immediately upstream of the substrate 23. The BSE detector 22 is configured to detect and quantify electrons backscattered from certain marks situated on the upstream-facing surface of the substrate 23 or on an upstream-facing surface of the substrate stage 24. For example, a mark on the substrate 23 can be scanned by a beam that has passed through a corresponding mark pattern on the reticle 10. By detecting backscattered electrons from the mark at the substrate, it is possible to determine the relative positional relationship of the reticle 10 and the substrate 23.

The substrate 23 is mounted to the substrate stage 24 via a wafer chuck (not shown but well understood in the art), which presents the upstream-facing surface of the substrate 23 in an XY plane. The substrate stage 24 (with chuck and substrate 23) is movable in the X and Y directions. Thus, by simultaneously scanning the reticle stage 11 and the substrate stage 24 in mutually opposite directions, it is possible to transfer each subfield within the optical field of the illumination-optical system as well as each subfield outside the optical field to corresponding regions on the substrate 23. The substrate stage 24 also includes a "position detector" 25 configured similarly to the position detector 12 of the reticle stage 11.

Each of the lenses 2, 3, 9, 15, 19 and deflectors 5, 8, 16 is controlled by a controller 31 via a respective coil-power controller 2a, 3a, 9a, 15a, 19a and 5a, 8a, 16a. Similarly, the reticle stage 11 and substrate stage 24 are controlled by the controller 31 via respective stage drivers 11a, 24a. The position detectors 12, 25 produce and route respective stage-position signals to the controller 31 via respective interfaces 12a, 25a each including amplifiers, analog-to-digital (A/D) converters, and other circuitry for achieving such ends. In addition, the BSE detector 22 produces and routes signals to the controller 31 via a respective interface 22a.

From the respective data routed to the controller 31, as a subfield is being transferred the controller 31 ascertains, inter alia, any control errors of the respective stage positions. To correct such control errors, the imaging-position deflector 16 is energized appropriately to deflect the patterned beam. Thus, a reduced image of the illuminated subfield on the reticle 10 is transferred accurately to the desired target position on the substrate 23. This real-time correction is made as each respective subfield image is transferred to the substrate 23, and the subfield images are positioned such that they are properly stitched together on the substrate 23.

Figure 3A:
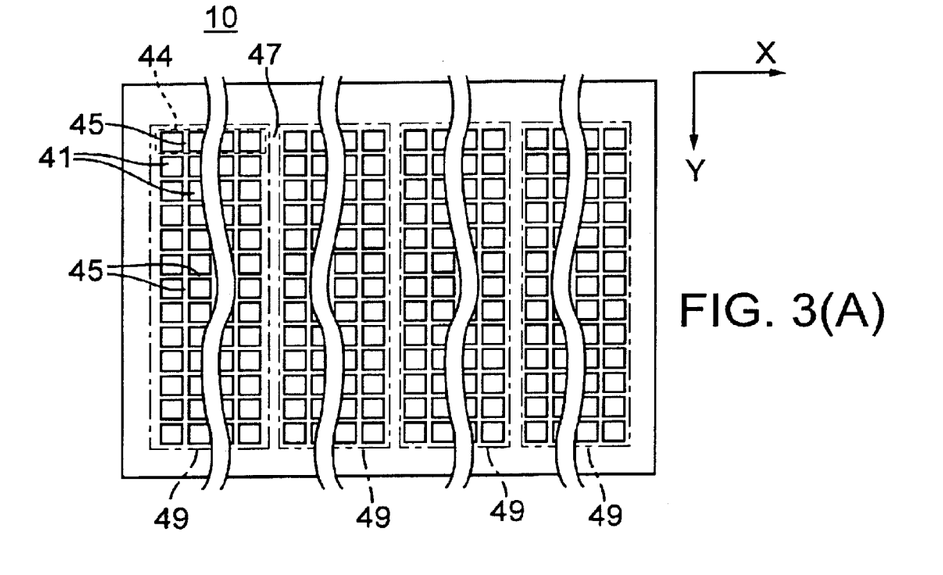
FIG. 3(A) is a plan view of a segmented reticle as used, for example, in the apparatus of FIG. 2.
Figure 3B:
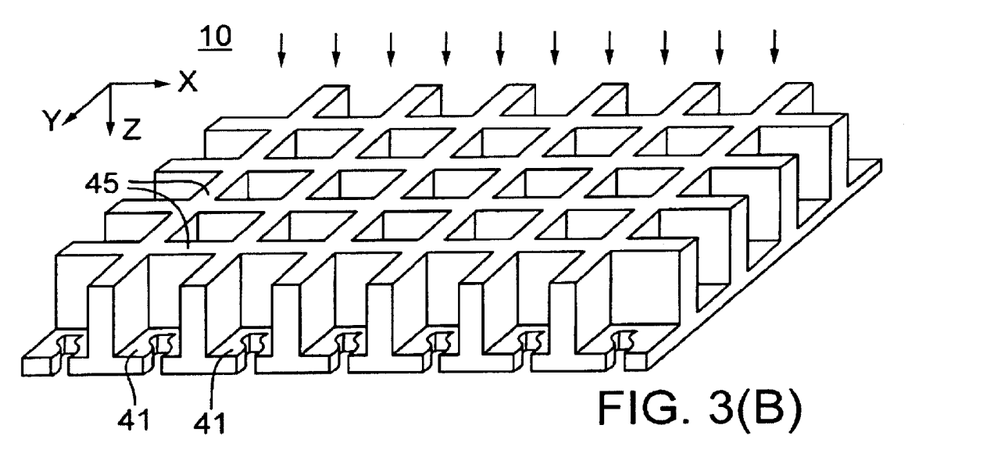
FIG. 3(B) is an oblique view of a portion of the reticle shown in FIG. 3(A).
Figure 3C:
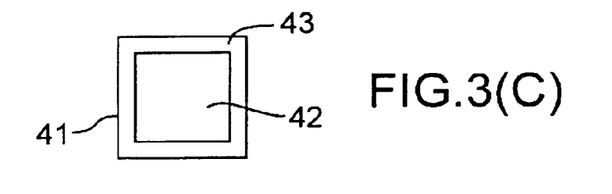
FIG. 3(C) is a plan view of a single subfield of the reticle of FIG. 3(A).

Details of an exemplary divided reticle 10 as used with the system of FIG. 2 are shown in FIGS. 3(A)–3(C). FIG. 3(A) is a plan view, FIG. 3(B) is an oblique view of a portion of the reticle, and FIG. 3(C) is a plan view of a single subfield. The depicted reticle 10 can be manufactured by electron-beam direct writing and etching of a silicon wafer, for example.

FIG. 3(A) shows the general configuration of the entire reticle 10. In the figure, multiple regions 49 are shown, each including a large respective array of subfields 41. The regions 49 are termed "stripes," and each stripe 49 extends in the Y direction. Each stripe 49 includes multiple rows 44 of subfields 41, wherein each row 44 extends in the X direction. Each subfield 41 comprises a respective portion of the reticle membrane (the membrane having a thickness of, e.g., 0.1 μm to several μm). In the depicted configuration, the subfields 41 in each row 44 and the rows 44 in each stripe 49 are separated from each other by respective "minor struts" 45. The stripes 49 are separated from each other by major struts 47.

As shown in FIG. 3(C), each subfield 41 comprises a respective pattern-defining region 42 surrounded by a skirt 43. In a particular subfield 41, the respective pattern-defining region 42 defines the pattern features of the respective portion of the pattern defined by that subfield 41. The skirt 43 is not patterned. During exposure of the particular subfield 41, only the respective pattern-defining region 42 is transferred; the respective skirt 43 is not transferred. The edges of the illumination beam incident on the subfield fall within the respective skirt 43. As discussed above, the reticle 10 can be a stencil type or a scattering-membrane type. I.e., either type of reticle 10 can be used with the apparatus of FIG. 2, for example.

The currently practicable size of the membrane area 42 of a single subfield 41 is approximately 0.5 to 5 mm square on the reticle 10. At a demagnification ratio of ⅕, for example, the size of the reduced subfield image as projected onto the substrate 23 is approximately 0.1 to 1 mm square.

The minor struts 45 intersect with each other at right angles to form a lattice of "grillage" that strengthens and confers rigidity to the reticle 10. By way of example, the minor struts 45 are each about 0.5 to 1 mm thick (in the Z direction) and about 0.1 mm wide (in the X or Y direction); the skirt 43 is about 0.05 mm wide, for example. The grillage includes the major struts 47 that confer additional rigidity and strength to the reticle 10. The major struts 47 are contiguous with the minor struts 45.

The rows 44 shown in FIG. 3(A) are also known as "electrical stripes" because exposure of each row involves an electrically induced deflection of the illumination and patterned beams using the subfield-selection and imaging-position deflectors 8, 16, respectively. Similarly, the stripes 49 shown in FIG. 3(A) are also known as "mechanical stripes" because exposure of a full stripe 49 involves mechanical movement of the reticle 10 and substrate 23 by the reticle stage 12 and substrate stage 24, respectively. Hence, multiple subfields 41 are arrayed in the X direction in the figure to form each electrical stripe 44, and multiple electrical stripes 44 are arrayed in the Y direction to form each mechanical stripe 49. The length of an electrical stripe 44 (equal to the width of the corresponding mechanical stripe 49) corresponds to the width of the optical field of the illumination-optical system (which corresponds to the width of a range of deflection achievable by the subfield-selection deflector 8).

As an alternative to the reticle configuration shown in FIGS. 3(A)–3(C), a segmented reticle can comprise electrical stripes in which the respective subfields are not separated from each other. In other words, in such an alternative reticle, the constituent subfields of each electrical stripe are contiguous with each other with no intervening minor struts 45 or skirts 43. However, minor struts 45 (and skirts) are still present between adjacent electrical stripes of a mechanical stripe, and major struts 47 are still present between adjacent mechanical stripes. During exposure of this type of segmented reticle, the constituent subfields of an electrical stripe are exposed in a continuous lateral scanning sweep of the illumination beam along the electrical stripe.

According to an effective exposure method, and referring further to the reticle 10 shown in FIG. 3(A), the subfields 41 in a selected electrical stripe 44 within a selected mechanical stripe 49 are sequentially illuminated by appropriate deflections of the illumination beam in the X direction. Successive electrical stripes 44 in the selected mechanical stripe 49 are exposed by continuous scanning motions of the stages 11, 24.

Figure 4:
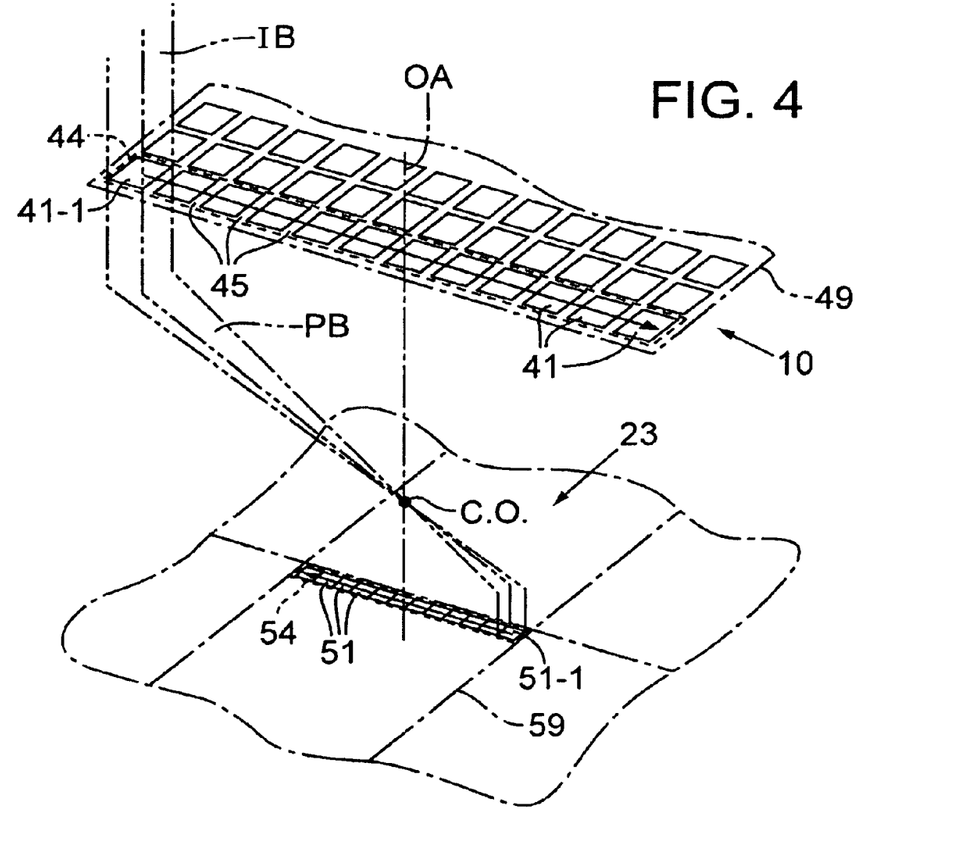
FIG. 4 is an oblique view that schematically depicts exposure of successive subfields of the reticle of FIG. 3(A), and placement of the resulting subfield images on a substrate.

General aspects of the exposure process summarized above are shown in FIG. 4. Shown at the upper portion of the figure is an end of one mechanical stripe 49 on the reticle 10, wherein the end is shown containing three electrical stripes 44. As described above, each electrical stripe 44 contains multiple constituent subfields 41 (individual patterned membrane portions 42 and skirts 43 are not shown) separated from each other by intervening minor struts 45. Minor struts 45 also separate individual electrical stripes 44 from each other in the mechanical stripe 49. Downstream of the reticle 10 along the optical axis OA is a corresponding region of the substrate 23 situated in opposition to the reticle. In the figure, the subfield 41-1 in the left corner of the electrical stripe 44 nearest the viewer is being illuminated by the illumination beam IB propagating from upstream. The resulting patterned beam PB downstream of the illuminated subfield 41-1 is being exposed (by the projection-lens assembly 15, 19, not shown) onto a corresponding region 51-1 on the surface of the substrate 23. As can be seen, the image in the region 51-1 is reduced (demagnified) relative to the corresponding subfield 41-1. The position of the region on the substrate surface at which the image is formed is achieved by action of the imaging-position deflector 16 (FIG. 2).

Between the reticle 10 and the substrate 23, the patterned beam PB is deflected twice by the collective action of the projection lenses 15, 19. The first deflection (performed by the first projection lens 15) is from a direction parallel to the optical axis OA to a direction in which the patterned beam intersects the optical axis OA. The second deflection (performed by the second projection lens 19) is a reverse of the first deflection.

The exact position 51 on the surface of the substrate 23 at which a transferred subfield image is formed is established such that the respective subfield images are contiguous with one another with no intervening spaces or the like. The respective positions 51 of the subfield images relative to each other typically correspond to the respective positions of the corresponding subfields 41 on the reticle 10. As noted above, this alignment of individual subfield images on the substrate 23 is achieved by appropriate deflections of the patterned beam by the imaging-position deflector 16 (FIG. 2). The subfield images as formed on the substrate 23 lack intervening grillage and skirts. To eliminate the grillage and skirts, the respective transfer position of each subfield image 51 is appropriately shifted by an amount that corresponds to the combined widths of the non-patterned skirt 43 and minor strut 45 associated with the subfield on the reticle.

This positional adjustment of subfield images on the substrate 23 must be performed in both the X and Y directions, and is achieved by appropriate deflections of the patterned beam as mediated by the imaging-position deflector 16.

Charged-particle scattering from a scattering portion of the reticle 10 is explained as follows, using the example of electron scattering. As noted above, impingement of the illumination beam at a point on a scattering portion of the reticle 10 produces a cone of scattered electrons diverging from the corresponding point on the downstream-facing surface of the reticle 10. The apex of the cone (on the corresponding point on the downstream-facing surface) defines a scattering angle. The scattering angle is a function of certain variables, notably the acceleration voltage of the illumination beam, the particular electron-scattering substance used in the reticle 10 and encountered by the illumination beam, and the membrane thickness of the reticle 10. The scattering angle can be quite wide.

Figure 5:
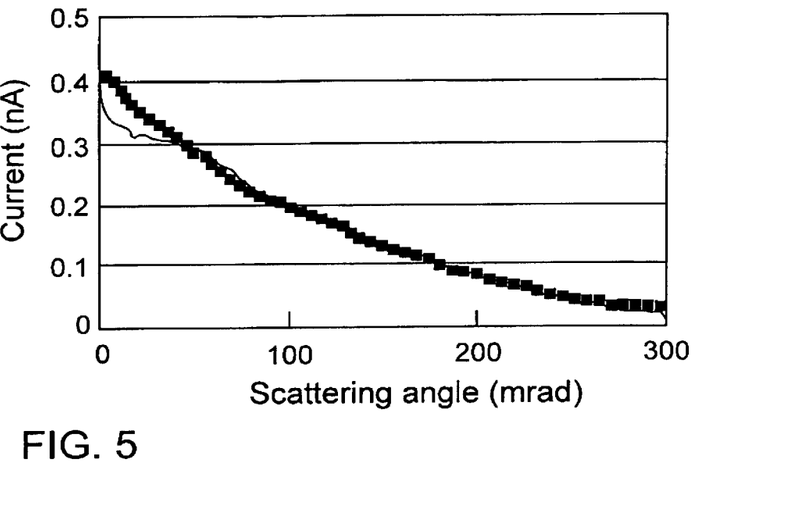
FIG. 5 is a plot of electron-scattering angles corresponding to beam current of a patterned beam scattered from a scattering region of a reticle.
Figure 6:
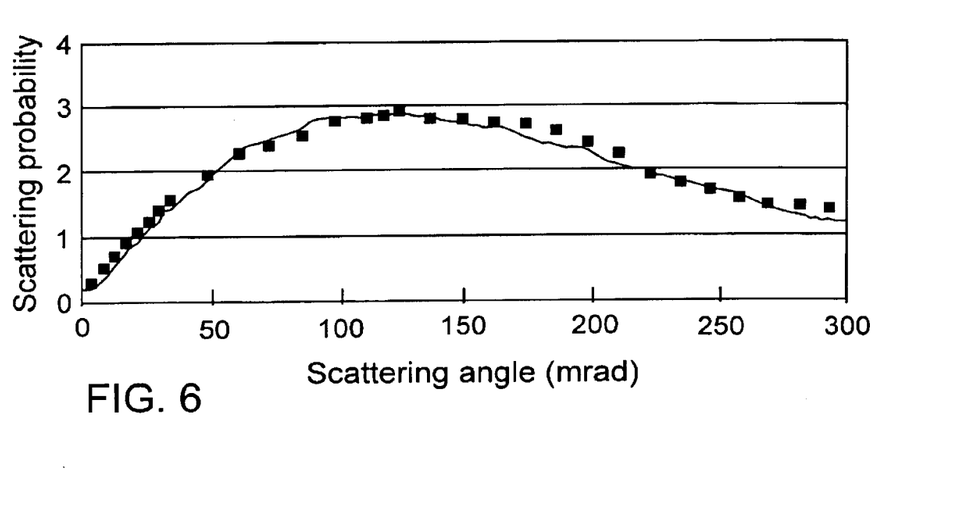
FIG. 6 is a plot of respective scattering probabilities associated with various scattering angles of a patterned beam scattered from a scattering region of a reticle.

Simulations and examples of electron scattering from stencil reticles are disclosed in Yahiro et. al., *Proceedings of 60th Annual Meeting of the Japan Society of Applied Physics*, 4a-E-4, Autumn, 1999. In an example disclosed in this reference, a reticle comprising a silicon membrane 2 μm thick was irradiated (on a beam-scattering portion thereof) with an electron beam accelerated by a voltage ranging from 50 to 140 kV. A plot of electrical currents corresponding to respective scattering angles is shown in FIG. 5. Of this data, a plot of the scattering probability versus scattering angle (mrad) is shown in FIG. 6. (FIG. 6 integrates on the circumference of the electron-scattering region of FIG. 5, using the unit scattering angle.)

More specifically, FIG. 5 depicts the distribution of the electron-scattering angle of the scattered beam (abscissa) with corresponding values of electric current (ordinate). A plot of simulation data is indicated by the solid-line curve, and experimental data are indicated by the dots. In this example, a 0.4 nA current is associated with a scattering angle of 0 mrad, a 0.2 nA current is associated with a scattering angle of 100 mrad, and a 0.03 nA current is associated with a scattering angle of 300 mrad.

In FIG. 6, the abscissa is of electron-scattering angle, and the ordinate is "rate" (arbitrary unit of scattering probability) of electrons, in the beam transmitted through the reticle, that are scattered at the respective scattering angles. In FIG. 6, a plot of simulation data is indicated by the solid-line curve, and experimental data are indicated by the dots. In this example, the rate of scattered electrons at 0 mrad is approximately 0.2, approximately 2.8 at a scattering angle of 100 mrad, and approximately 1.4 at a scattering angle of 300 mrad.

Electron scattering from a scattering reticle as used in a CPB microlithography apparatus employing the "SCALPEL" (scattering with angular limitation in projection electron-beam lithography) technique is described in Mkrtchan et. al., *Vac. Sci. Technol.* B16:3385, 1998. In this study, two examples were investigated. A first example involved a scattering membrane in which a 200-nm thick W (tungsten) scattering layer was applied to a 350-nm thick $Si_3N_4$ membrane. This membrane was irradiated with an electron beam at an acceleration voltage of approximately 120 kV. A second example involved a scattering membrane in which a 50-nm thick W (tungsten) scattering layer was applied to a 50-nm thick $Si_3N_4$ membrane. This membrane was irradiated with an electron beam at an acceleration voltage of approximately 120 kV.

Figure 7:
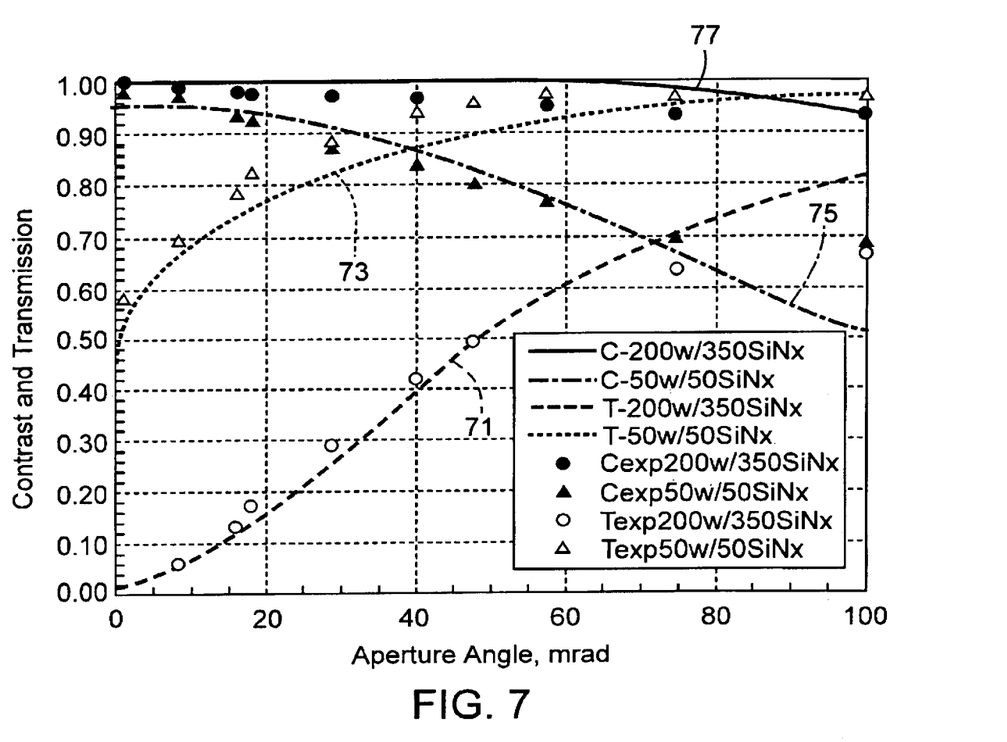
FIG. 7 is a plot of transmission and contrast data as functions of aperture angle.

Data regarding transmission and contrast as functions of aperture angle are plotted in FIG. 7, in which the abscissa is electron-scattering angle ("aperture angle") and the ordinate is contrast and transmission of the electron beam through the reticle.

In FIG. 7, with increased aperture angle, transmission (curves 71 and 73) is correspondingly increased, since more electrons pass through the reticle membrane at larger aperture angles. For example, at an aperture angle of 0 mrad from a scattering membrane having a 200-nm thick W (tungsten) scattering layer on a 350-nm thick $Si_3N_4$ membrane, transmission is nearly zero (curve 71). As another example, at an aperture angle of 0 mrad from a scattering membrane having a 50-nm thick W scattering layer on a 50-nm thick $Si_3N_4$ membrane, transmission is about 50% (curve 73). Contrast data corresponding to the transmission curves 71, 73 are plotted as curves 75 and 77, respectively.

In any event, the crossover image formed at the back focal plane of the first projection lens 15 is normally approximately 1 to 2 mm in diameter. From an optical standpoint, an electron beam passing through a non-scattering portion of the reticle completely passes through this crossover point to irradiate the reticle 23. Hence, if a diaphragm 18 were installed at the back focal plane for the purpose of blocking scattered electrons, the diameter of the aperture defined by the diaphragm plate desirably would be larger than the diameter of the crossover image. In this regard, an exemplary aperture diameter at the back focal plane is approximately 4 to 5 mm whenever the crossover-image diameter is approximately 1 to 2 mm.

Figure 8:
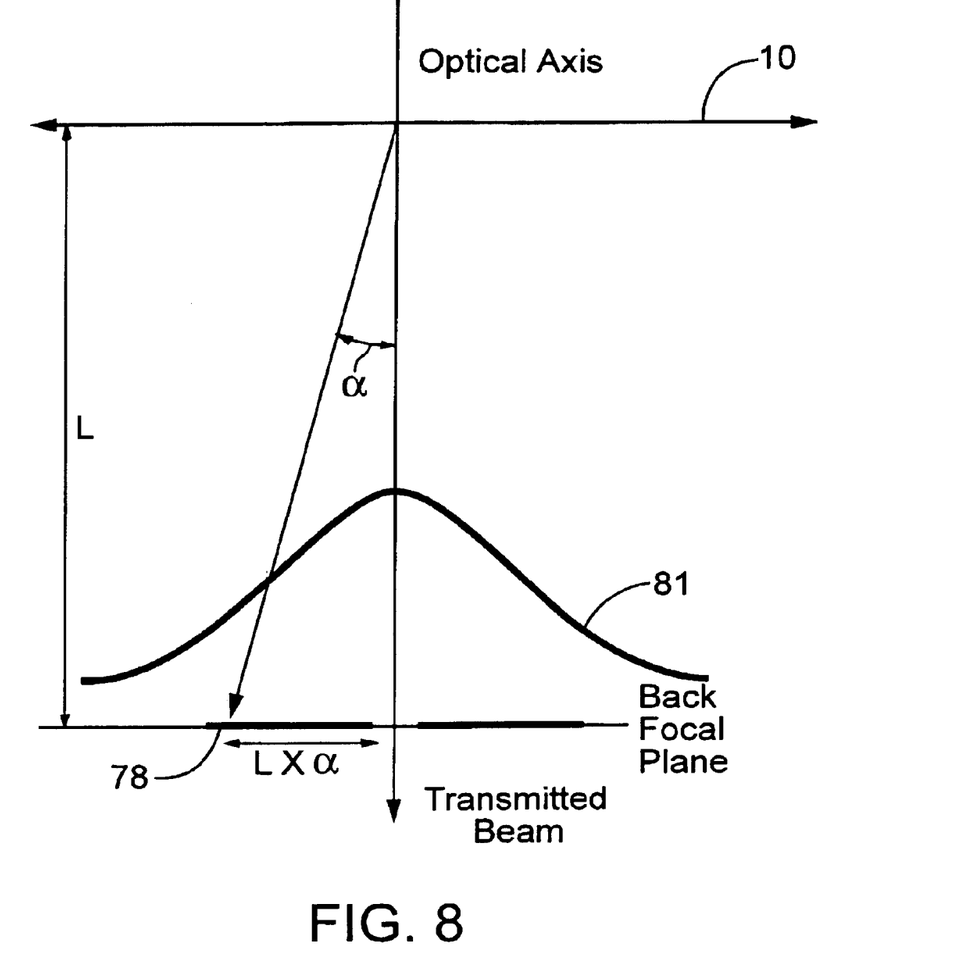
FIG. 8 schematically depicts certain dimensional, angular, and scattering relationships within the projection optical system of a CPB microlithography apparatus such as that of FIG. 2.

FIG. 8 schematically depicts the relationship between the projection-optical system of the microlithography apparatus and distribution of electron scattering. The reticle 10 is shown in the upper portion of FIG. 8. Also shown is the trajectory of electrons passing through the reticle 10 to a diaphragm 78 located at the back focal plane of the first projection lens. The axial distance from the reticle 10 to the diaphragm 78 is denoted "L", and the electron-scattering angle from the reticle is denoted "α". Whenever L is sufficiently large relative to the scattering angle α, the lateral divergence (from the optical axis) of the scattered electrons at the back focal plane is L·α. This L·α divergence is more appropriately represented as a corresponding electron-scattering distribution 81 depicted above the diaphragm 78.

For example, consider a 2-μm thick Si reticle membrane irradiated with an electron beam at an acceleration voltage of approximately 100 kV. The distance L from the reticle 10 to the diaphragm 78 is 300 mm, assuming the average diameter of the electron-beam trajectory in the beam tube of the projection-optical system is 10 mm (conventionally the smallest inner diameter of the beam tube). The corresponding scattering angle α (which determines the radius of the aperture 18) is 10 mm/(2·300 mm), which is approximately equal to 17 mrad. Referring to FIG. 6, at a scattering angle of 17 mrad, the corresponding percent of scattered electrons is 1% or less. Hence, in this instance, 99% or more of the electrons scattered by the reticle would strike the beam tube before reaching the diaphragm 78 at the back focal plane. With an electron-scattering percentage at this level, placing a cutoff-plate assembly defining a large-diameter aperture at a more upstream position than the back focal plane would provide a sufficient diaphragm effect without having to utilize the diaphragm 78 at the back focal plane.

Figure 1A:
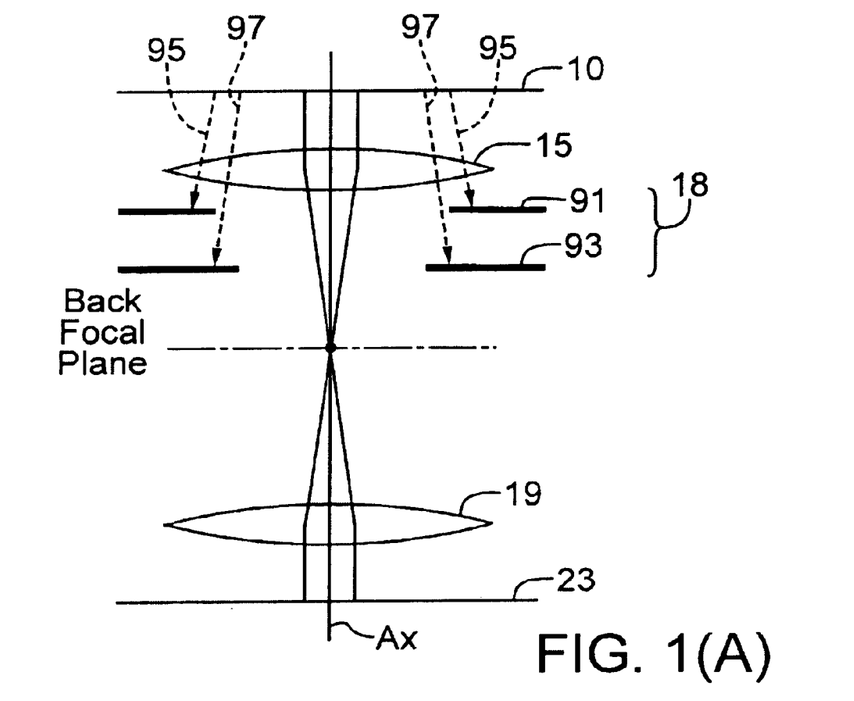
FIG. 1(A) is a schematic diagram showing scattering-electron blocking by a projection-optical system in a charged-particle-beam (CPB) microlithography apparatus according to an embodiment. The depicted projection-optical system includes a cutoff-plate assembly, comprising two cutoff plates, situated along the optical axis downstream of the first projection lens but upstream of the back focal plane of the first projection lens.
Figure 1B:
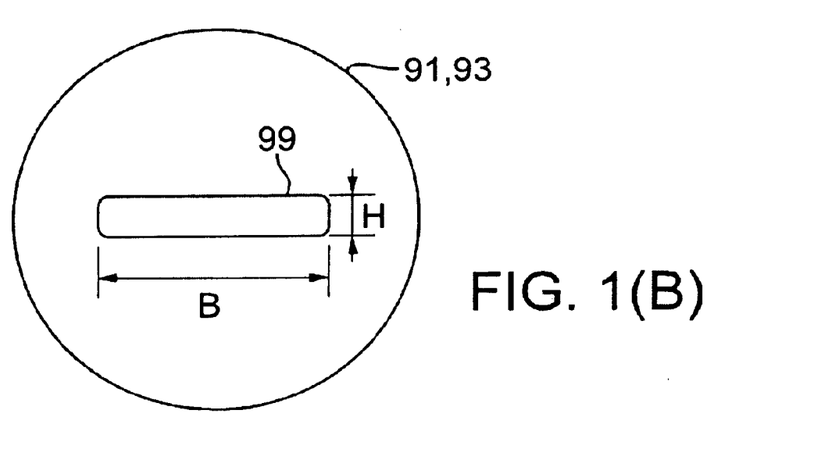
FIG. 1(B) is a plan view of an exemplary cutoff plate as used in the cutoff-plate assembly.

In view of the foregoing, details of a representative embodiment of a cutoff-plate assembly 18 in the projection-optical system of a CPB microlithography apparatus are depicted in FIGS. 1(A)–1(B). FIG. 1(A) schematically depicts relevant portions of the projection-optical system and FIG. 1(B) is a plan (transverse to the optical axis) view of one of the cutoff plates. The reticle 10 is situated at the upper portion of FIG. 1(A). The first projection lens 15 is downstream of the reticle 10. In this embodiment, two cutoff plates 91, 93, each defining a respective wide aperture, are installed downstream of the first projection lens 15 but upstream of the back focal plane. The aperture defined by the more upstream cutoff plate 91 is wider than the aperture defined by the more downstream cutoff plate 93. Note that a beam crossover is formed at the back focal plane downstream of the cutoff plate 93. The second projection lens 19 is situated downstream of the back focal plane. The substrate 23 is situated downstream of the second projection lens 19.

In FIG. 1(A), scattered electrons 95, 97 that have passed through the first projection lens 15 are denoted by respective dashed lines. Scattered electrons 95 having a larger scattering angle are blocked by the cutoff plate 91 having the larger-diameter aperture. Scattered electrons 97 having a smaller scattering angle are blocked by the cutoff plate 93 having the smaller-diameter aperture.

A plan view applicable to either of the cutoff plates 91, 93 is provided in FIG. 1(B). An aperture 99 is defined in the middle of the respective cutoff plate 91, 93 centered on the optical axis. The aperture 99 desirably is laterally extended in the CPB-deflection direction (i.e., in the direction in which the imaging-position deflector 16 laterally deflects the patterned beam for scanning an electrical stripe). The length B of the aperture 99 corresponds to twice the maximum deflection of the patterned beam from the optical axis Ax. The width H of the aperture 99 is determined based on a consideration of the scattering angle and the installation position of the respective cutoff plate to achieve blocking of the scattered electrons in a manner as shown in FIG. 1(A).

By providing multiple cutoff plates upstream of the back focal plane in the general manner shown and described, scattered charged particles are progressively blocked in corresponding stages. This progressive-blocking scheme provides less destabilization of the patterned beam from excessive temperature of the cutoff plates, compared to using only one cutoff plate. Also, because the respective apertures defined in the cutoff plates are larger than an aperture in a conventional scattering aperture located at the back focal plane, the patterned beam is less adversely affected by contamination of the apertures.

If slight fogging of the image occurs from the scattered electrons, it still is possible to include a conventional scattering aperture at the back focal plane. In such an instance, because most of the scattered charged particles are blocked by the upstream cutoff plates 91, 93, problems associated with excessive temperature increases and contamination of the scattering aperture are substantially alleviated compared to conventional apparatus.

Figure 9:
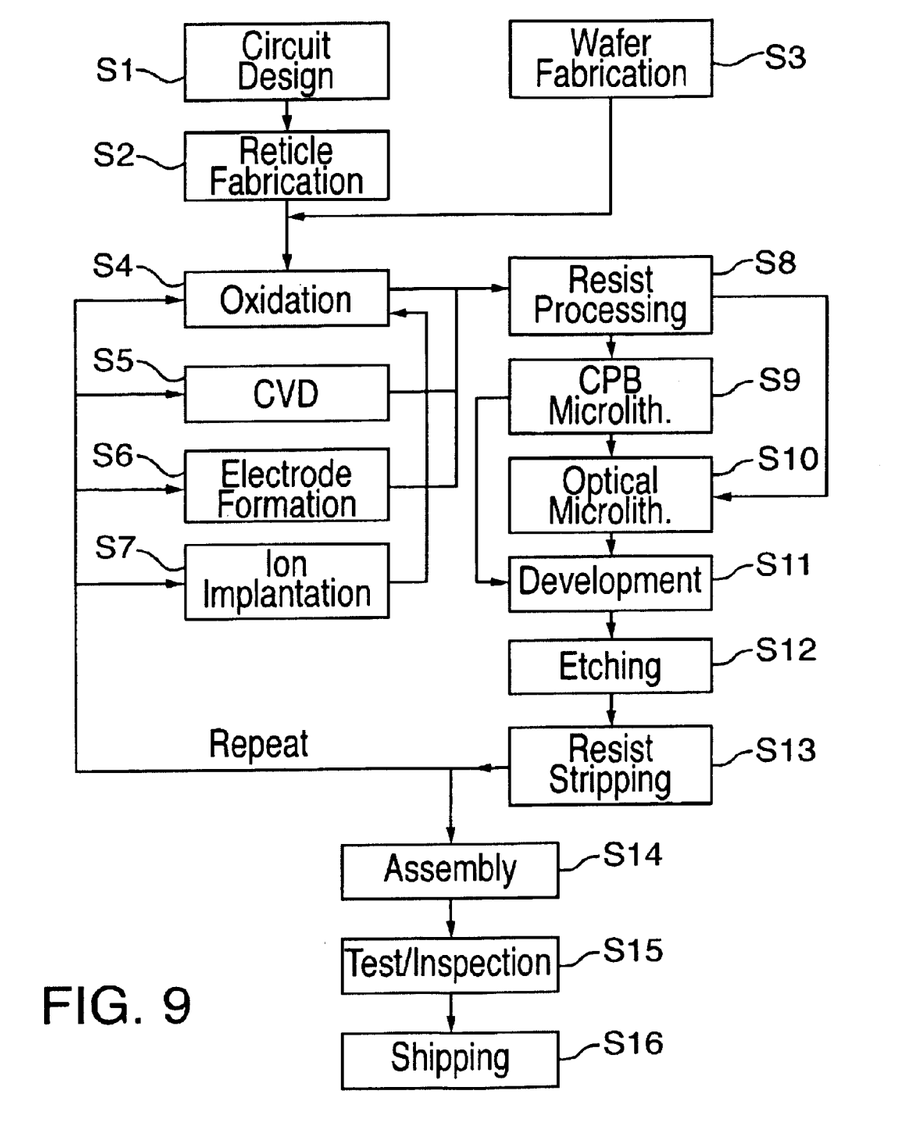
FIG. 9 is a flowchart of steps in a process for manufacturing a microelectronic device such as a semiconductor chip (e.g., integrated circuit or LSI), liquid-crystal panel, CCD, thin-film magnetic head, or micromachine, the process including performing microlithography using a microlithography apparatus according to the invention.

FIG. 9 is a flow chart of steps in a process for manufacturing a microelectronic device such as a semiconductor chip (e.g., an integrated circuit or LSI device), a display panel (e.g., liquid-crystal panel), charged-coupled device (CCD), thin-film magnetic head, micromachine, for example. In step S1, the circuit for the device is designed. In step S2, a reticle ("mask") for the circuit is manufactured. In step S2, local resizing of pattern elements can be performed to correct for proximity effects or space-charge effects during exposure. In step S3, a wafer is manufactured from a material such as silicon.

Steps S4–S13 are directed to wafer-processing steps, in which the circuit pattern defined on the reticle is transferred onto the wafer by microlithography. Step S14 is an assembly step (also termed a "post-process" step) in which the wafer that has been passed through steps S4–S13 is formed into semiconductor chips. This step can include, e.g., assembling the devices (dicing and bonding) and packaging (encapsulation of individual chips). Step S15 is an inspection step in which any of various operability and qualification tests of the device produced in step S14 are conducted. Afterward, devices that successfully pass step S15 are finished, packaged, and shipped (step S16).

Steps S4–S13 also provide representative details of wafer processing. Step S4 is an oxidation step for oxidizing the surface of a wafer. Step S5 involves chemical vapor deposition (CVD) for forming an insulating film on the wafer surface. Step S6 is an electrode-forming step for forming electrodes on the wafer (typically by vapor deposition). Step S7 is an ion-implantation step for implanting ions (e.g., dopant ions) into the wafer. Step S8 involves application of a resist (exposure-sensitive material) to the wafer. Step S9 involves microlithographically exposing the resist using a charged particle beam to as to imprint the resist with the reticle pattern of the reticle produced in step S2. In step S9, a CPB microlithography apparatus as described above can be used. Step S10 involves microlithographically exposing the resist using optical microlithography. This step also can be performed using a reticle produced in step S2 can be used. Step S11 involves developing the exposed resist on the wafer. Step S12 involves etching the wafer to remove material from areas where developed resist is absent. Step S13 involves resist separation, in which remaining resist on the wafer is removed after the etching step. By repeating steps S4–S13 as required, circuit patterns as defined by successive reticles are formed superposedly on the wafer.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. In a charged-particle-beam (CPB) microlithography apparatus, a CPB optical system, comprising:

an illumination-optical system situated and configured to direct a charged-particle illumination beam onto a selected region of a reticle defining a pattern to be transferred to a sensitive substrate, the reticle being configured with relatively low-scattering regions and relatively high-scattering regions that collectively define the pattern, the low-scattering regions being transmissive to the illumination beam while causing little to no scattering of charged particles of the beam, and the high-scattering regions being transmissive to the illumination beam while causing comparatively large scattering, relative to the low-scattering regions, of charged particles of the beam; and a projection-optical system situated downstream of the illumination-optical system and configured to direct a patterned beam, formed by passage of the illumination beam through the selected region on the reticle and carrying an aerial image of a respective portion of the pattern defined in the selected region, to a corresponding location on a sensitive substrate, the projection-optical system comprising a first projection lens situated axially closer to the reticle and having a back focal plane, a second projection lens situated axially closer to the substrate, and a cutoff-plate assembly situated between the reticle and the back focal plane, the cutoff-plate assembly defining an aperture configured to block downstream propagation of at least 90% of the patterned beam scattered from the high-scattering regions of the reticle.

2. The CPB optical system of claim 1, wherein the cutoff-plate assembly is situated between the first projection lens and the back focal plane.

3. The CPB optical system of claim 1, wherein the cutoff-plate assembly comprises multiple cutoff plates arranged at respective positions along an optical axis, each cutoff plate defining a respective aperture.

4. The CPB optical system of claim 3, wherein a first cutoff plate located closer to the reticle has a larger aperture than a second cutoff plate located downstream of the first cutoff plate.

5. The CPB optical system of claim 1, wherein:

the cutoff-plate assembly comprises multiple cutoff plates each defining a respective aperture; and the aperture in at least one of the cutoff plates is configured as a slot laterally extended in a beam-deflection direction.

6. The CPB optical system of claim 1, wherein:

the charged particle beam is an electron beam; and the illumination-optical system is configured to accelerate the illumination beam at a voltage of at least 50 kV.

7. A charged-particle-beam microlithography apparatus, comprising a CPB optical system as recited in claim 1.

8. In a charged-particle-beam microlithography apparatus for transferring a pattern, defined by a reticle including a relatively low-scattering portion and a relatively high scattering portion, from the reticle to a sensitive substrate using a charged particle beam, a projection-optical system, comprising a first projection lens situated axially closer to the reticle and having a back focal plane, a second projection lens situated axially closer to the substrate, and a cutoff-plate assembly situated between the reticle and the back focal plane, the cutoff-plate assembly defining an aperture configured to block downstream propagation of at least 90% of charged particles of a charged particle beam scattered from the high-scattering regions of the reticle.

9. In a charged-particle-beam (CPB) microlithography apparatus for transferring a pattern, defined by a reticle including a relatively low-scattering portion and a relatively high scattering portion, from the reticle to a sensitive substrate using a charged particle beam, a CPB optical system, comprising:

an illumination-optical system; and a projection-optical system, comprising a first projection lens situated axially closer to the reticle and having a back focal plane, a second projection lens situated axially closer to the substrate, and a cutoff-plate assembly situated between the reticle and the back focal plane, the cutoff-plate assembly defining an aperture configured to block downstream propagation of at least 90% of charged particles of a charged particle beam scattered from the high-scattering regions of the reticle.

10. A charged-particle-beam microlithography method in which a pattern, defined by a reticle including a relatively low-scattering portion and a relatively high scattering portion, is transferred from the reticle to a sensitive substrate using a charged particle beam, the method comprising:

directing a charged-particle illumination beam to a selected region on the reticle including the relatively low-scattering portion and the relatively high-scattering portion so as to produce a patterned beam, propagating downstream of the reticle, containing charged particles that have been scattered by passage through the high-scattering portion;

directing the patterned beam through a projection-lens system to a selected corresponding region on the sensitive substrate, the projection-lens system including a first projection lens situated downstream of the reticle and having a back focal plane, and a second projection lens situated downstream of the first projection lens; and as the patterned beam is directed through the projection-optical system, blocking downstream propagation of at least 90% of the charged particles that were scattered by passage through the high-scattering portion, the blocking being performed at a location between the reticle and the back focal plane.

11. The method of claim 10, wherein the blocking step is performed using a cutoff-plate assembly located between the reticle and the back focal plane, the cutoff-plate assembly comprising at least one cutoff plate arranged at a respective position along an optical axis of the projection-lens system, the cutoff plate defining a respective aperture.

12. A method for manufacturing a microelectronic device, comprising a charged-particle-beam microlithography method as recited in claim 10.

* * * * *